United States Patent
Yasui

(10) Patent No.: US 12,441,960 B2
(45) Date of Patent: Oct. 14, 2025

(54) CLEANING LIQUID AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Masato Yasui, Ibo Hyogo (JP)

(73) Assignees: Kabushiki Kaisha Toshiba, Kawasaki (JP); Toshiba Electronic Devices & Storage Corporation, Kawasaki (JP)

(*) Notice: Subject to any disclaimer, the term of this patent is extended or adjusted under 35 U.S.C. 154(b) by 357 days.

(21) Appl. No.: 18/113,138

(22) Filed: Feb. 23, 2023

(65) Prior Publication Data

US 2024/0124799 A1    Apr. 18, 2024

(30) Foreign Application Priority Data

Sep. 26, 2022   (JP) ................. 2022-152645

(51) Int. Cl.
*C11D 1/72*    (2006.01)
*C11D 3/30*    (2006.01)
(Continued)

(52) U.S. Cl.
CPC ............... *C11D 1/72* (2013.01); *C11D 3/30* (2013.01); *C11D 17/0008* (2013.01); *H01L 21/565* (2013.01); *H01L 23/295* (2013.01); *H01L 23/3121* (2013.01); *H01L 23/49579* (2013.01); *H01L 24/32* (2013.01); *H01L 24/83* (2013.01);
(Continued)

(58) Field of Classification Search
CPC ....... C11D 1/72; C11D 3/2006; C11D 3/2068; C11D 3/30; C11D 7/263; C11D 7/32; C11D 7/3218; C11D 17/0008; H01L 23/3121; H01L 23/49579; H01L 24/32; H01L 24/83
See application file for complete search history.

(56) References Cited

U.S. PATENT DOCUMENTS

| | | | |
|---|---|---|---|
| 4,495,335 A | 1/1985 | Geist | |
| 9,217,929 B2 | 12/2015 | Egbe et al. | |
| 2020/0224058 A1* | 7/2020 | Leonov ................. | C09K 13/02 |

FOREIGN PATENT DOCUMENTS

| | | |
|---|---|---|
| JP | S58-196271 A | 11/1983 |
| JP | 4442817 B2 | 3/2010 |

(Continued)

OTHER PUBLICATIONS

E. Niki et al., "Autoxidation of Butyl Ether", Journal of the Japan Petroleum Institute, vol. 23, No. 6, pp. 403-407, 1980.

(Continued)

*Primary Examiner* — Brian P Mruk
(74) *Attorney, Agent, or Firm* — Kim & Stewart LLP

(57) ABSTRACT

In general, according to one embodiment, a cleaning liquid includes a glycol ether-based cleaning agent and a compound represented by chemical formula (1) below, where R is an NH$_2$ group or H, and n is 1 or more.

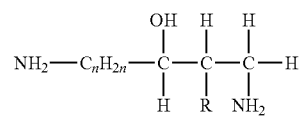

(1)

11 Claims, 5 Drawing Sheets

(51) Int. Cl.
  *C11D 7/32* (2006.01)
  *C11D 17/00* (2006.01)
  *H01L 21/56* (2006.01)
  *H01L 23/00* (2006.01)
  *H01L 23/29* (2006.01)
  *H01L 23/31* (2006.01)
  *H01L 23/495* (2006.01)
(52) U.S. Cl.
  CPC . *C11D 2111/22* (2024.01); *H01L 2224/32245* (2013.01); *H01L 2224/83815* (2013.01); *H01L 2224/83911* (2013.01); *H01L 2924/35121* (2013.01)

(56) References Cited

FOREIGN PATENT DOCUMENTS

| | | |
|---|---|---|
| JP | 4819429 B2 | 11/2011 |
| JP | 2020014671 A | 1/2020 |
| JP | 6858209 B2 | 4/2021 |
| JP | 2022050320 A | 3/2022 |
| KR | 20220061646 A | 5/2022 |

OTHER PUBLICATIONS

Japanese Office Action mailed Aug. 12, 2025 in corresponding Japanese Patent Application 2022-152645 with English Translation, 8 pages.

\* cited by examiner

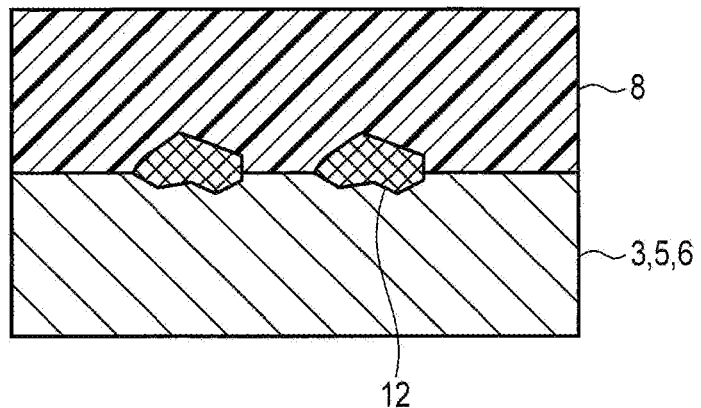
F I G. 3
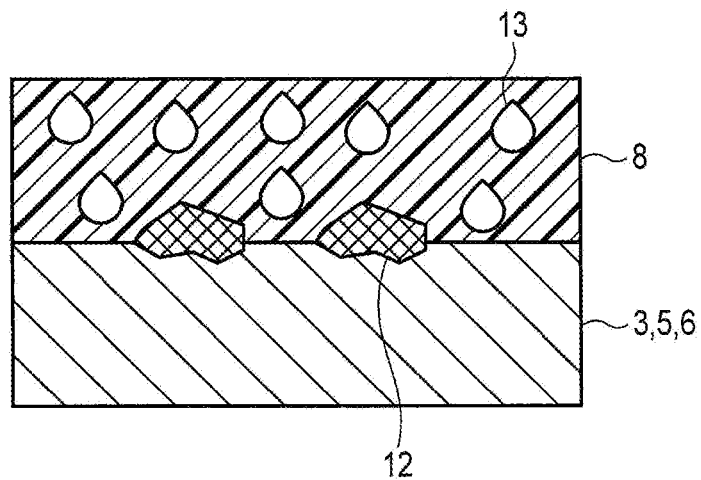
F I G. 4
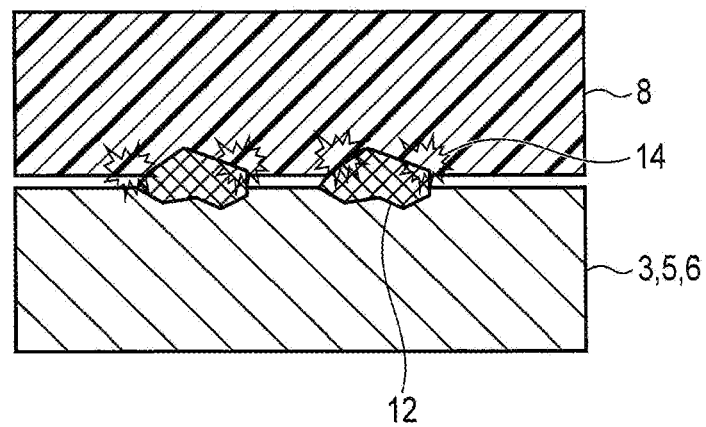
F I G. 5

CLEANING LIQUID AND METHOD FOR MANUFACTURING SEMICONDUCTOR DEVICE

CROSS-REFERENCE TO RELATED APPLICATIONS

This application is based upon and abstracts the benefit of priority from Japanese Patent Application No. 2022-152645, filed Sep. 26, 2022, the entire contents of which are incorporated herein by reference.

FIELD

Embodiments described herein generally relate to a cleaning liquid and a method for manufacturing a semiconductor device.

BACKGROUND

In recent years, there is an increasing demand for high reliability of semiconductors. Semiconductor devices may fail due to peeling between a mold resin and a frame caused by a thermal stress, a high temperature and high humidity environment, etc., and may fail to satisfy requirements for high reliability.

BRIEF DESCRIPTION OF THE DRAWINGS

FIG. 3 is a schematic diagram illustrating a state in which a carboxylate salt has changed to a pumice-like substance after a durability test.

FIG. 4 is a schematic diagram illustrating a state in which water is accumulated in the pumice-like substance in the durability test.

FIG. 5 is a schematic diagram illustrating a state in which a steam explosion has occurred in the durability test.

DETAILED DESCRIPTION

Figure 1:
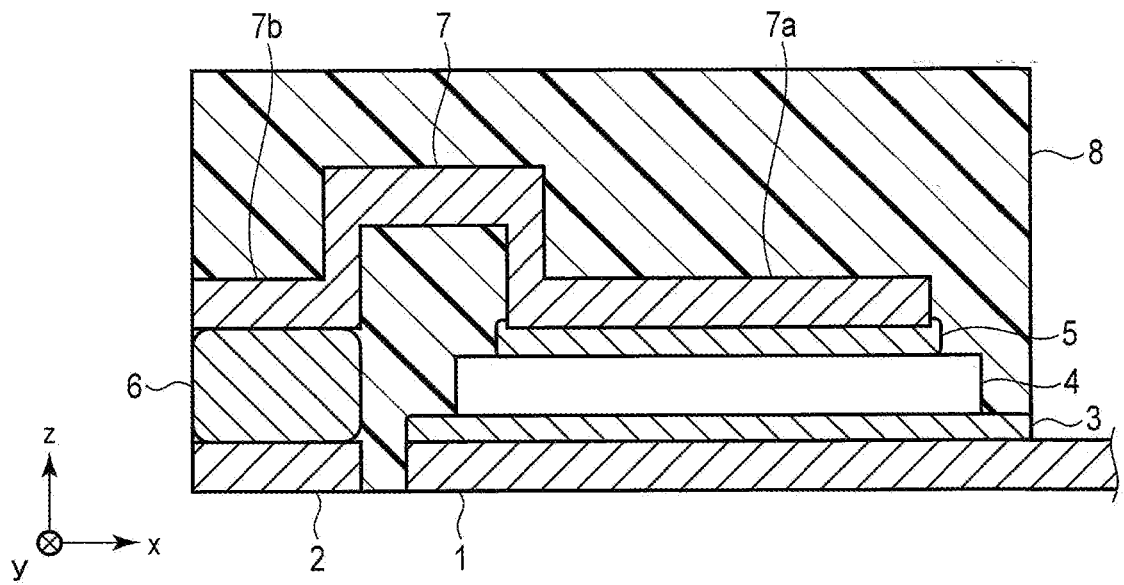
FIG. 1 is a cross-sectional view schematically illustrating an example of a semiconductor device which is to be cleaned with a cleaning liquid according to an embodiment.

In general, according to one embodiment, a cleaning liquid containing a glycol ether-based cleaning agent and a compound represented by the following formula (1) is provided.

[Chemical Formula 1]

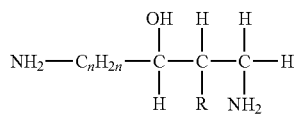

(1)

wherein R is an $NH_2$ group or H, and n is 1 or more.

According to the another embodiment, a method for manufacturing a semiconductor device can be provided. The method for manufacturing a semiconductor device includes: solder-joining a semiconductor chip to a conductor; cleaning the conductor and the semiconductor chip with a cleaning liquid according to the embodiment; and sealing at least part of the conductor and the semiconductor chip with resin.

Embodiments will be described below with reference to the accompanying drawings. In the description set forth below, components having substantially the same functions and configurations will be denoted by the same reference numerals, and repeated description may be omitted. The drawings are schematic and do not exactly show the actual relationships between thicknesses and plan dimensions or actual ratios among the thicknesses of the layers. In addition, the drawings may include portions having different dimensional relationships and ratios. The descriptions of one embodiment are all applicable to the other embodiments, unless such application is excluded explicitly or obviously. Each embodiment described below merely exemplifies a device and a method for embodying the technical idea of the embodiment. The element materials, shapes, structures, arrangements etc. described in connection the technical idea of each embodiment are not limited to the ones described below.

The present inventors have investigated why a molded resin peels off a semiconductor device in a high-temperature and high-humidity environment, and the investigation will be described below with reference to FIGS. 1-5. Although the semiconductor device is not limited to a specific type, the semiconductor device illustrated in FIG. 1 will be taken as an example to facilitate understanding of the invention.

The semiconductor device shown in FIG. 1 includes a first conductor 1, a second conductor 2, a first solder layer 3, a semiconductor chip 4, a second solder layer 5, a third solder layer 6, a third conductor 7, and a molded resin 8. The semiconductor device is, for example, a power semiconductor device, such as a MOSFET (Metal Oxide Semiconductor Field Effect Transistor) or an IGBT (Insulated Gate Bipolar Transistor). The first conductor 1 and the second conductor 2 are lead frames. A first major surface of the semiconductor chip 4, which is along the xy plane, is joined with a first surface of the first conductor 1, which is along the xy plane, by means of the first solder layer 3. The third conductor 7 is, for example, a clip portion. The third conductor 7 is a connector having a first joint portion 7a and a second joint portion 7b. The first joint portion 7a is joined with the second major surface of the semiconductor chip 4, which is along the xy plane, by means of the second solder layer 5. The second joint portion 7b is joined with the first surface of the second conductor 2 by means of the third solder layer 6. The third conductor 7 promotes of the heat dissipation from the semiconductor chip 4, and also realizes low resistance. The molded resin 8 covers the surfaces of the first, second and third conductors 1, 2 and 7, except for the lead portions (not shown), and the surface of the semiconductor chip 4. Also, the molded resin 8 also fills the gaps between the members. Thus, the semiconductor chip and the first, second, and third conductors excluding at least the lead portions are sealed with resin. The first, second, and third conductors 1, 2, and 7 can be made, for example, of Cu and a Cu alloy. Although FIG. 1 shows an example in which the first conductor 1 and the second conductor 2 have lead portions, the third conductor 7 may have lead portions.

A semiconductor device equipped in a vehicle is one application of device. Since the semiconductor device equipped in a vehicle is used with a vehicle engine, it must be designed to cause no defect under a high temperature and high humidity condition. Therefore, durability tests are performed based on the standards of JEITA (Japan Electronics and Information Technology Industries Association) and JEDEC (JEDEC Solid State Technology Association). As one of the durability tests, there is a test in which a semiconductor device is forcibly placed under a high temperature and high humidity condition and the durability thereof is confirmed. In this test, the semiconductor device after molding is left to stand for 168 hours in an environment with a humidity of 85% and a temperature of 85° C., and then reflow is performed (a peak temperature of 260° C.). If a defect is confirmed in this test, the semiconductor device is discarded. The cause of the defect is attributable to a carboxylate salt that adheres to the semiconductor device during the manufacturing process of the semiconductor device. The mechanism in which a defect is caused by the carboxylate salt will be described with reference to FIGS. 2 to 5.

Figure 2:
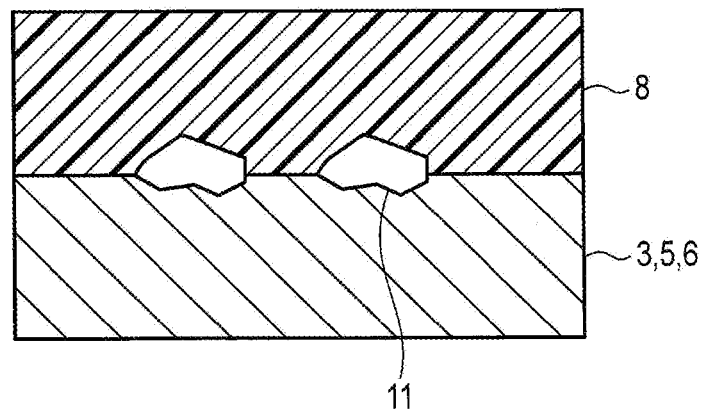
FIG. 2 is a schematic diagram illustrating a state in which a carboxylate salt is present between a solder layer and a molded resin.

As shown in FIG. 2, a carboxylate salt 11 is included between the molded resin 8 and the first solder layer 3, the second solder layer 5 or the third solder layer 6 of the semiconductor device during the manufacturing process. An example of the carboxylate salt 11 is lead formate (Pb (HCOO)$_2$). If the above-described durability test is performed on the semiconductor device in this state, the carboxylate salt 11 is decomposed and changed into a pumice-like substance 12 by the heat applied thereto, as shown in FIG. 3. Where the carboxylate salt 11 is lead formate, it changes to a pumice-like lead oxide according to the reaction formula shown in Chemical Formula 2.

[Chemical Formula 2]

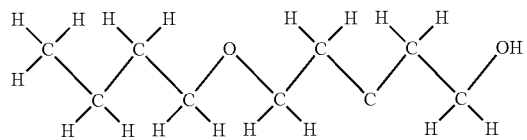

A pumice-like lead oxide is highly hygroscopic. Therefore, if exposed to a high temperature and high humidity atmosphere in the durability test, the pumice-like substance 12 absorbs moisture and retains a water component 13, as shown in FIG. 4. If heat is applied in the reflow of the durability test, steam explosion 14 occurs as shown in FIG. 5, and the molded resin 8 peels off. Of the portions of the molded resin 8, those that are in contact with the first conductor 1, the second conductor 2 or the third conductor 7 are likely to peel off.

The present inventors found that the carboxylate salt 11 is formed by the reaction between a carboxylic acid and Pb contained in the solder layer of the semiconductor device, and that the carboxylic acid is produced in the cleaning process of the semiconductor device manufacturing process. A cleaning liquid containing a glycol ether-based cleaning agent is used as a cleaning liquid for cleaning the flux. A glycol ether-based cleaning liquid is decomposed by peroxide formation during use and a carboxylic acid is produced thereby. This reaction mechanism will be described by taking, as an example, diethylene glycol monobutyl ether (also referred to as 2-(2-butoxyethoxy)ethanol), which is a glycol ether-based cleaning agent. Chemical Formula 3 shows the structural formula of diethylene glycol monobutyl ether.

[Chemical Formula 3]

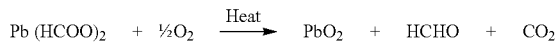

Figure 6:
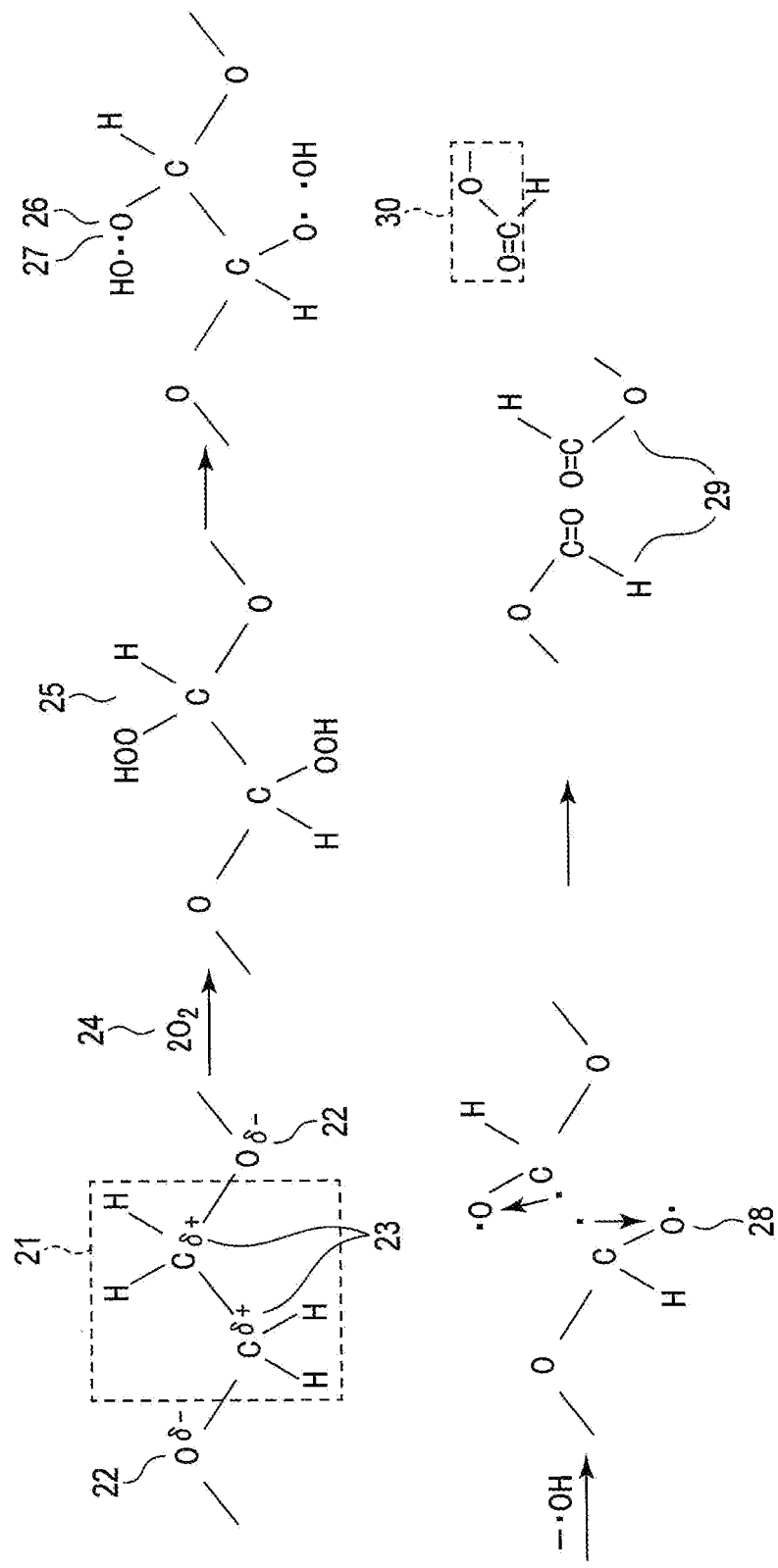
FIG. 6 is a schematic diagram illustrating an example of a reaction mechanism in which diethylene glycol monobutyl ether decomposes due to the formation of a peroxide.

Since diethylene glycol monobutyl ether has a hydrocarbon chain, an ether bond and a hydroxy group, it has both lipophilicity and hydrophilicity and exhibits surface activity. As shown in FIG. 6, in the diethylene glycol monobutyl ether, the carbon atoms surrounded in the broken-line rectangular frame 21 are the carbon atoms 23 sandwiched by the ether bonds 22. Since the oxygen atom has a high electronegativity, C—O is in a polarized state, resulting in a weak C—H bond. As a result, the carbon atoms 23 are positively polarized. Oxygen 24 in the ambient air acts on the carbon atoms 23 and a peroxide 25 is formed thereby. In general, ethers tend to form peroxides. It can therefore be presumed that the reaction that produces the peroxide 25 proceeds even at room temperature. The —O—O-bond in the peroxide 25 is weak and easily broken. If the bond breaks, a radical (active oxygen) 26 is produced. The "·" next to O represents an electron 27. Numeral 28 refers to a state in which the remaining radical 26 takes away the electron involved in the C—C bond, and the C—C bond is broken thereby. The hydroxyl radical ·OH generated by this breaking reaction promotes decomposition of the cleaning agent. The radical breaks the C—C bond to form a C=O bond, producing formic acid ester 29 such as butyl ester formate and monoformate-1,2-ethanediol. Chemical Formula 4 shows the reaction in which diethylene glycol monobutyl ether is oxidized to produce butyl ester formate and monoformate-1,2-ethanediol.

[Chemical Formula 4]

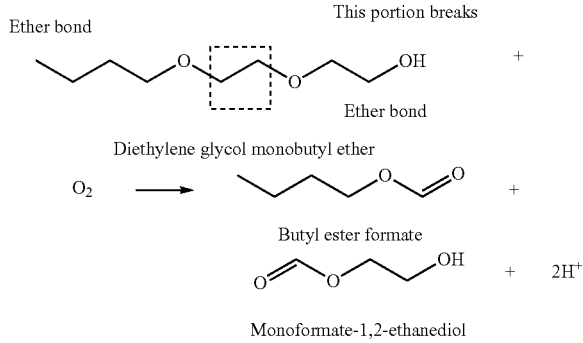

A substance having an ester bond produces a carboxylic acid when it reacts with water. The chemical structure enclosed in the broken-line frame 30 in FIG. 6 is a structure from which a formic acid is produced. Thus, formic acid ester 29 produces a formic acid when it reacts with water. An example of a reaction formula for producing a formic acid is shown in Chemical Formula 5. Although details are not shown here, it has been confirmed that diethylene glycol monobutyl ether produces a butyric acid as well as the formic acid.

[Chemical Formula 5]

Butyl ester formate

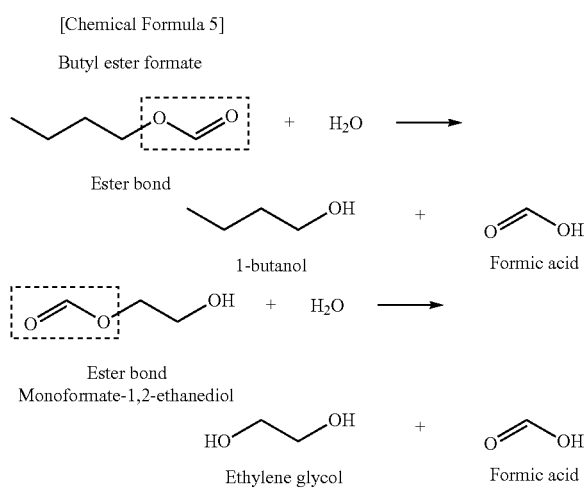

A glycol ether-based cleaning agent exists other than diethylene glycol monobutyl ether. For example, ethylene glycol monomethyl ether, ethylene glycol monobutyl ether, propylene glycol monomethyl ether, diethylene glycol monohexyl ether, etc. can be named. Structural formulas of these will be described later. The fact that a carboxylic acid is produced from these glycol ether-based cleaning agents is described, for example, in Etsuo NIKI and Yoshio KAMITANI, "Oxygen Oxidation Reaction of Butyl Ether", Journal of the Japan Petroleum Institute, J. Japan Petrol. Inst., Vol. 23, No. 6, pp. 403-407, 1980 (hereinafter referred to as Non-Patent Literature 1). Specifically, the introduction on page 403 of Non-Patent Literature 1 describes that a carbon atom adjacent to an ether bond bonds with oxygen to form a peroxide (hydroperoxide). The right column on page 405 of Non-Patent Literature 1 and FIG. 1 describe that the reaction of ether and oxygen forms a peroxide (hydroperoxide) in many cases.

From the description in the left column on page 404 of Non-Patent Literature 1, it can be seen that the reaction forming a peroxide takes place at about 60° C. Incidentally, an example of use temperature at which the cleaning liquid of the embodiment is used is from 50° C. to 60° C.

In the left column on page 406 of Non-Patent Literature 1, it is described that ether peroxides decompose, with a metal salt acting as a catalyst, and esters such as butyl formate and butyl butyrate are produced thereby. Esters react with water to produce carboxylic acids (e.g., a formic acid and a butyric acid). In the method of the embodiment described below, the cleaning liquid may contain lead salts and copper salts. These lead salts and copper salts can function as the catalyst mentioned above. In the method of the embodiment, water can be included in the cleaning liquid by ingress from the atmosphere or decomposition of the cleaning liquid.

In the right column on page 404 of Non-Patent Literature 1, it is also described that a formic acid and a butyric acid may be directly produced by the reaction of ether with oxygen, and that esters are likely to be produced due to an increase in the metal salt.

Figure 7:
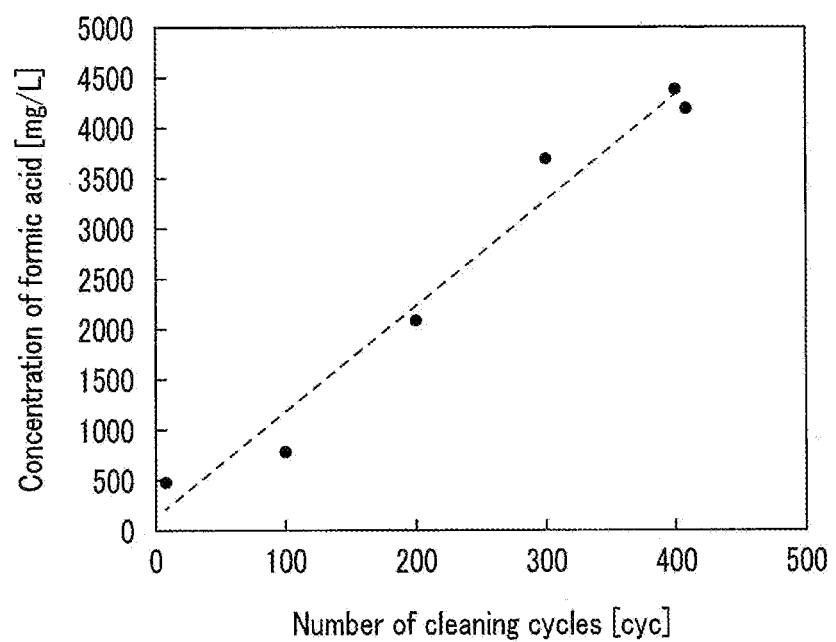
FIG. 7 is a graph illustrating the relationships between the number of cleaning cycles of flux cleaning and the concentration of formic acid in a cleaning liquid.

As described above, carboxylic acids such as a formic acid and a butyric acid are produced by the decomposition of the cleaning agent in the cleaning liquid. The present inventors confirmed that a formic acid is produced in the cleaning liquid, by conducting an experiment. This experiment will be described below. A substrate after reflow, which was to be processed, was subjected to flux cleaning, using a cleaning liquid containing diethylene glycol monobutyl ether as a glycol ether-based cleaning agent. A series of steps of immersing the substrate in the cleaning liquid, cleaning, rinsing and drying were defined as one cycle, and 500 cycles were performed. The temperature of the cleaning liquid was set at 55° C. and was kept such that the temperature difference from the set value was within 5° C. (in the range of (55-5°) C to (55+5°) C). The concentration of formic acid in the cleaning liquid was measured by ion chromatography, after 9 cycles, after 100 cycles, after 200 cycles, after 300 cycles, after 400 cycles, and after 409 cycles. As a measuring device, an ion chromatography system ICS-2100 commercially available from Thermo Fisher Scientific was used. The results of measurement are shown in FIG. 7. The horizontal axis of FIG. 7 represents the number of cleaning cycles, and the vertical axis thereof represents the concentration of formic acid in the cleaning liquid (mg/L). As is apparent from FIG. 7, the concentration of formic acid increased in accordance with an increase in the number of cleaning cycles. The cleaning liquid in the late 400 cleaning cycles contained more than 4000 mg of formic acid per liter. The increase in the concentration of formic acid is attributed to the result of decomposition due to oxidation of the cleaning liquid.

The carboxylic acid in the cleaning liquid reacts with lead contained, for example, in the first solder layer 3, second solder layer 5 or third solder layer 6 of the semiconductor device, and a carboxylate salt is formed thereby. Where the carboxylic acid is formic acid, lead formate is produced according to the reaction formula shown in Chemical Formula 6 below.

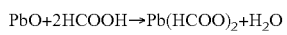   [Chemical Formula 6]

Lead formate may be formed directly on a solder layer, and lead formate particles contained in the cleaning liquid may redeposit on the semiconductor device. According to the mechanism described above, a carboxylate salt 11 such as lead formate exists between the molded resin 8 and one of the first solder layer 3, second solder layer 5 and third solder layer 6 of the semiconductor device. If the concentration of carboxylic acid in the cleaning liquid can be lowered, the occurrence of defects can be reduced under a high temperature and high humidity condition.

The present inventors have found a cleaning liquid capable of reducing carboxylic acid, which is a decomposition product of a cleaning agent, and a method for manufacturing a semiconductor device using this cleaning liquid. The cleaning liquid of the embodiment contains a glycol ether-based cleaning agent and a compound represented by the following formula (1) (hereinafter referred to as a first compound).

[Chemical Formula 7]

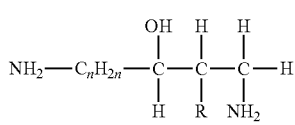

wherein R is an $NH_2$ group (amino group) or H, and n is 1 or more.

Chemical Formula 8 shows the structural formula of ethylenediamine. The first compound is an amine which has the structure of ethylenediamine as a basic skeleton and in which two hydrogen atoms of ethylenediamine are substituted with a hydroxy group and a hydrocarbon chain.

  [Chemical Formula 8]

$H_2N-H_2C-CH_2-NH_2$

The first compound can be synthesized, for example, by a cross-aldol reaction and a reductive amination reaction, using a first material composed of acetaldehyde or aminoacetaldehyde and a second material composed of dialdehyde (a substance having two aldehyde groups). Details will be described below.

The structural formula of acetaldehyde is shown in Chemical Formula 9.

[Chemical Formula 9]

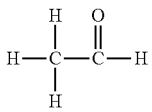

The structural formula of aminoacetaldehyde is shown in Chemical Formula 10.

[Chemical Formula 10]

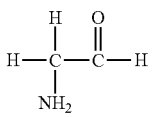

The structural formula of dialdehyde is shown in Chemical Formula 11.

[Chemical Formula 11]

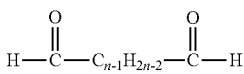

wherein n is 2 or more.

(Generation of Aldol by Cross-Aldol Reaction)

A cross-aldol reaction is used to synthesize an aldol from dialdehyde and acetaldehyde or aminoacetaldehyde. The cross-aldol reaction is a reaction in which two kinds of aldehydes or ketones are made to react in a basic condition to synthesize an aldol. The aldol is a generic term for substances having an aldehyde group and a hydroxyl group. As shown in the reaction formula of Chemical Formula 12, acetaldehyde or aminoacetaldehyde is made to react with any kind of dialdehyde under a basic condition, and an aldol (enclosed in the broken-line frame in Chemical Formula 12) is synthesized thereby.

[Chemical Formula 12]

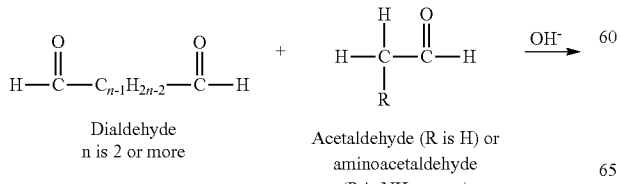

Dialdehyde
n is 2 or more

Acetaldehyde (R is H) or
aminoacetaldehyde
(R is NH₂ group)

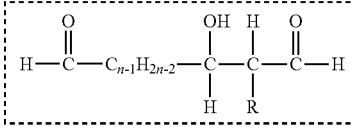

To be used for next synthesis Aldol
(generic term for substances
having aldehyde group and
hydroxyl group)

(Addition of Amino Group by Reductive Amination Reaction)

An amino group is added to the aldol in a reductive amination reaction. It should be noted here that the reductive amination reaction is a reaction in which an aldehyde and a ketone are made to react with ammonia, a primary amine and a secondary amine under a reducing condition to synthesize an amine. As shown in the reaction formula of Chemical Formula 13, the aldehyde groups of the aldol (the groups surrounded in the broken-line frames in Chemical Formula 13) are made to reach with ammonia, and an amino group is added by the reductive amination reaction. As a result, the first compound is obtained.

[Chemical Formula 13]

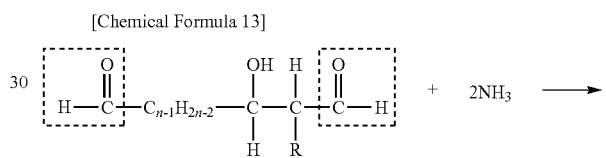

Synthesized substance in preceding stage
R is H or NH₂ group

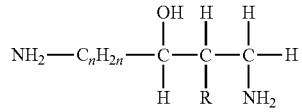

Since the terminating end of the hydrocarbon chain of the first compound is an amino group (NH₂ group), the first compound can bond with a carboxylic acid, and the formation of a water-soluble ammonium salt is promoted thereby. Chemical Formula 14 shows a reaction formula between an amine and formic acid. The water-soluble ammonium salt does not react with a solder layer and is easily dissolved in water. Therefore, even if the ammonium salt adheres to the semiconductor device, it can be removed by a water rinse.

[Chemical Formula 14]

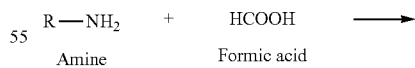

Amine         Formic acid

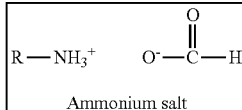

Ammonium salt

Since R of the first compound is an amino group or H, the amino group can promote complex formation with copper in the cleaning liquid. Redeposition of copper on the semiconductor device can be suppressed by dissolving the copper into the cleaning liquid as a complex. Since copper powder derived from the first, second and third conductors 1, 2 and 7 floats in the cleaning agent, there is a possibility that the copper powder will adhere to the product, adversely affecting the properties. Like ethylenediamine, the first compound dissolves the copper powder in the cleaning agent in the form of a copper complex, and can therefore suppress redeposition on the semiconductor device.

A chemical structural formula in which one molecule of ethylenediamine forms a complex with a copper atom is shown in Chemical Formula 15.

[Chemical Formula 15]

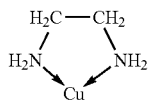

As in the case of ethylenediamine, the first compound is a bidentate ligand. Where the first compound forms a complex with copper, this state can be confirmed by the change of color of the cleaning liquid from colorless to blue.

The hydroxy groups (OH groups) of the first compound can enhance the water solubility of the first compound.

The hydrocarbon chain $((CH_2)_n)$ of the first compound can enhance the lipophilicity of the first compound. Since the boiling point of pentylamine $(C_5H_{11}NH_2)$, which has 5 carbon atoms, is approximately 100° C., the boiling point of the first compound can be made higher than the boiling point of water by setting the value of n to be within the range of 3 to 5. Thus, volatilization of the first compound from the cleaning liquid can be suppressed. In addition, by setting the value of n to be within the range of 3 to 5, the synthesis of the first compound can be facilitated.

Since the first compound is an amine, it exhibits alkaline property. By including the first compound in the cleaning liquid, the alkaline property of the cleaning liquid can be increased, so that the cleaning property of the cleaning liquid can be improved.

The content of the first compound in the cleaning liquid can be made to be within the range of 1 wt % to 2 wt %. As shown in the experimental results mentioned above, it was found that the cleaning liquid made of pure diethylene glycol monobutyl contained 4000 mg/L of formic acid at the time of 400 cycles. Assuming that the concentration of formic acid increases linearly, it can be estimated that 5000 mg/L of formic acid is contained at the time of 500 cycles. This concentration is approximately 0.11 mol/L. It is considered that the amount of formic acid can be a desirable level by setting a minimum of 0.11 mol of the first compound in 1 liter of cleaning liquid. By setting the content of the first compound in the cleaning liquid to be within the range of 1 wt % to 2 wt %, the amount of carboxylic acid such as formic acid can be sufficiently reduced.

A glycol ether-based cleaning agent will be described. The glycol ether-based cleaning agent is not particularly limited as long as it has both lipophilicity and hydrophilicity and has surface activity. For example, it may be a cleaning agent represented by the following formula (2).

[Chemical Formula 16]

$$C_xH_{2X+1}-O-C_YH_{2Y}-A \quad (2)$$

wherein x is 1 or more, y is 1 or more, and A is a hydroxy group or a group containing both an ether bond and a hydroxy group. As long as x is 1 or more and y is 1 or more, they are not limited to particular values, but the upper limit of x can be set to 6 and the upper limit of y can be set to 2.

Examples of cleaning agents represented by formula (2) set forth above include ethylene glycol monomethyl ether, ethylene glycol monobutyl ether, diethylene glycol monobutyl ether (2-(2-butoxyethoxy) ethanol), propylene glycol monomethyl ether, and diethylene glycol monohexyl ether. The structural formula of each cleaning agent is shown in Table 1 below. The kinds of cleaning agents to be used can be one kind or two or more kinds selected from the above.

TABLE 1

| Chemical Name | Characteristic Formula |
| --- | --- |
| ethylene glycol monomethyl ether | $CH_3-O-C_2H_4-OH$ |
| ethylene glycol monobutyl ether | $C_4H_9-O-C_2H_4-OH$ |
| diethylene glycol monobutyl ether | $C_4H_9-O-C_2H_4-O-C_2H_4-OH$ |
| propylene glycol monomethyl ether | $CH_3-O-CH_2-CH(OH)\,(CH_3)$ |
| diethylene glycol monohexyl ether | $C_6H_{13}-O-C_2H_4-O-C_2H_4-OH$ |

The content of the glycol ether-based cleaning agent in the cleaning liquid can be a value that is within the range of 90 wt % to 99 wt %.

The cleaning liquid may contain a glycol ether-based cleaning agent and components other than the first compound. Examples of other components include water, metal salts, etc. Water may be included in the cleaning liquid due to ingress from the atmosphere, decomposition of the cleaning agent, or the like.

According to the cleaning liquid of the above-mentioned embodiment, the glycol ether-based cleaning agent is decomposed by air oxidation of the cleaning liquid during use to produce a carboxylic acid (e.g., formic acid or butyric acid), but the first compound contained in the cleaning liquid causes a neutralization reaction with the carboxylic acid, and the carboxylic acid can be converted into a water-soluble ammonium salt. The water-soluble ammonium salt does not react with a solder layer and is easily dissolved in water. Therefore, even if the ammonium salt adheres to the semiconductor device, it can be removed by a water rinse. As a result, the concentration of carboxylic acid in the cleaning liquid can be reduced, so that the reaction between Pb in the solder layers of the semiconductor device and the carboxylic acid can be suppressed. Therefore, adhesion of the carboxylate salt (e.g., lead formate) to the semiconductor device can be suppressed. It is therefore possible to reduce the defect that the molded resin of the semiconductor device peels off under a high temperature and high humidity condition.

In addition, since the first compound can form a complex with the copper powder in the cleaning liquid and dissolve the copper into the cleaning liquid, redeposition of the copper powder on the semiconductor device can be suppressed, and defects due to adhesion of the copper powder is prevented.

Figure 8:
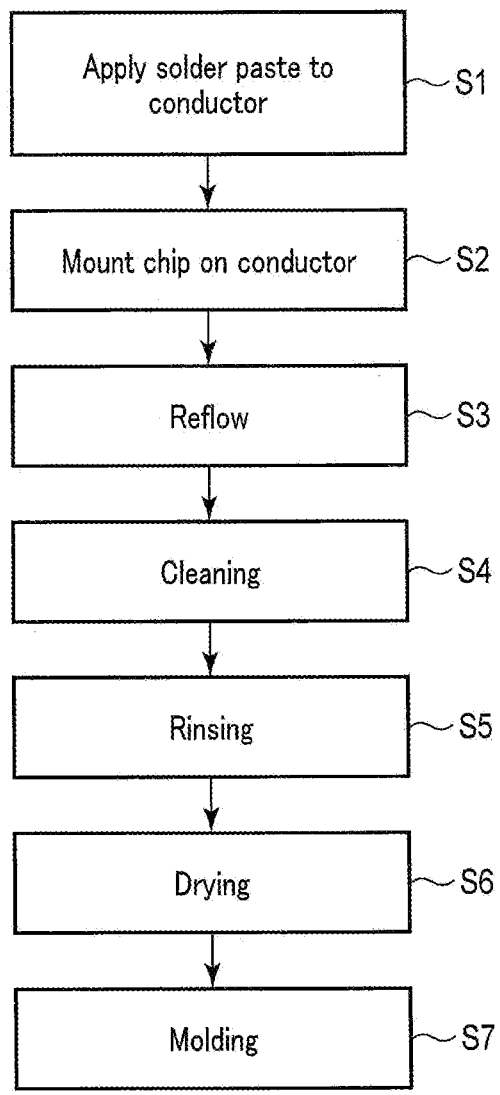
FIG. 8 is a diagram illustrating an example of a flowchart illustrating a method according to an embodiment.

The cleaning liquid of the embodiment can be used, for example, in a method for manufacturing a semiconductor device. The method for manufacturing a semiconductor device using the cleaning liquid of the embodiment will be described with reference to FIGS. 8 and 1. The method for manufacturing a semiconductor device includes applying solder paste to conductors (e.g., first, second, and third conductors 1, 2 and 7) (S1), mounting a semiconductor chip 4 on the conductors (e.g., first, second and third conductors 1, 2 and 7) (S2), performing reflow (S3), cleaning (S4), rinsing (S5), drying (S6), and molding (S7). Steps S1 to S7 will be described below.

The solder paste used in step S1 contains components such as a solder alloy and flux. The flux is made of an organic material, for example. The solder paste forms a solder layer by performing the reflow (S3). By the reflow (S3), a first solder layer 3 is formed between the semiconductor chip 4 and the first conductor 1, a second solder layer 5 is formed between the first joint portion 7a of the third conductor 7 and the semiconductor chip 4, and a third solder layer 6 is formed between the second joint portion 7b of the third conductor 7 and the second conductor 2. In this manner, the first, second and third conductors 1, 2 and 7 and the semiconductor chip 4 are solder-joined to each other. The resultant structure will be referred to as a substrate to be processed, for the sake of convenience of description.

Cleaning (S4) is performed to remove such impurities as flux from the substrate to be processed. The cleaning liquid used then is the cleaning liquid of the embodiment.

Examples of the cleaning method include: directly immersing the substrate to be processed in the cleaning liquid; spraying the substrate to be processed with the cleaning liquid; and brushing the substrate to be processed with the cleaning liquid.

The temperature of the cleaning liquid can be, for example, in the range of 50° C. to 60° C.

Rinsing (S5) is performed for removing the cleaning agent etc. remaining on the substrate to be processed. As the rinsing step, a water rinse in which rinsing is performed with water can be named.

Drying (S6) is for drying the substrate to be processed.

A series of steps including the cleaning, the rinsing and the drying may be set as one cycle, and a plurality of cycles can be performed.

Molding (S7) is performed by resin molding, for example. Epoxy resin, phenol resin, etc. can be used as the resin for molding. One kind or two or more kinds of resin can be used. A filler, such as silica ($SiO_2$) particles, may be added to the resin. An example of a composition used for molding includes a composition containing epoxy resin, phenol resin and silica particles.

Examples of the molding method include various methods such as a transfer molding method and a compression molding method. There is also a molding method using a potting gel. The transfer molding method is a method in which a resin is softened by heating in a plunger, and the softened resin is poured into a die and cured. Since the softened resin is used, the resin can easily fill even gaps of a semiconductor device having a complicated shape.

By molding (S7), the semiconductor chip and the portions of the first, second, and third conductors excluding at least the lead portions are sealed with resin. Thus, a semiconductor device having the structure shown in FIG. 1 is obtained.

In the above-mentioned method for manufacturing a semiconductor device according to the embodiment includes: solder-joining a semiconductor chip to a conductor; cleaning the conductor and the semiconductor chip by use of the cleaning liquid according to the embodiment; and sealing at least part of the conductors and the semiconductor chip with resin. According to this method, adhesion of the carboxylate salt to the semiconductor device can be suppressed, so that a defect such as peeling off of the molded resin under a high temperature and high humidity condition can be reduced. Moreover, since the copper powder floating in the cleaning liquid is prevented from redepositing on the semiconductor device, the occurrence of defects due to the redeposited copper powder can be reduced. Accordingly, a highly reliable semiconductor device can be provided.

The cleaning liquid according to at least one embodiment described above comprises a glycol ether-based cleaning agent and a compound represented by the formula (1), so that the occurrence of defects in semiconductor devices can be suppressed under a high temperature and high humidity condition.

[Chemical Formula 17]

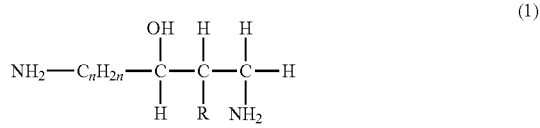

(1)

wherein R is an $NH_2$ group (amino group) or H, and n is 1 or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A cleaning liquid comprising:
a glycol ether-based cleaning agent; and
a compound represented by chemical formula (1) below,

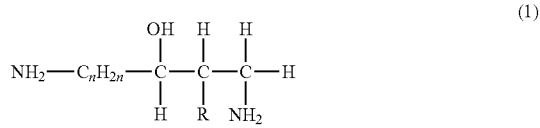

(1)

wherein R is an $NH_2$ group or H, and n is 1 or more.

2. The cleaning liquid according to claim 1, wherein n is in a range of 3 to 5.

3. The cleaning liquid according to claim 1, wherein the glycol ether-based cleaning agent is represented by chemical formula (2) below:

$$C_xH_{2x+1}-O-C_yH_{2y}-A \qquad (2)$$

wherein x is 1 or more, y is 1 or more, and A is a hydroxyl group or a group containing an ether bond and a hydroxyl group.

4. The cleaning liquid according to claim 1, wherein the glycol ether-based cleaning agent is at least one kind selected from the group consisting of ethylene glycol monomethyl ether, ethylene glycol monobutyl ether, diethylene glycol monobutyl ether, propylene glycol monomethyl ether and diethylene glycol monohexyl ether.

5. The cleaning liquid according to claim 1, wherein a content of the glycol ether-based cleaning agent in the cleaning liquid is within a range of 90 wt % to 99 wt %.

6. The cleaning liquid according to claim 1, wherein a content of the compound in the cleaning liquid is within a range of 1 wt % to 2 wt %.

7. The cleaning liquid according to claim 1, wherein the cleaning liquid is alkaline.

8. The cleaning liquid according to claim 1, further comprising water.

9. A method for manufacturing a semiconductor device, comprising:
   solder-joining a semiconductor chip to a conductor;
   cleaning the conductor and the semiconductor chip by the cleaning liquid recited in claim 1; and
   sealing at least part of the conductor and the semiconductor chip with a resin.

10. The method for manufacturing a semiconductor device according to claim 9, wherein the conductor contains at least one of Cu and a Cu alloy.

11. The method for manufacturing a semiconductor device according to claim 9, wherein a temperature of the cleaning liquid is in a range of 50° C. to 60° C.

* * * * *